US012652810B2

(12) United States Patent
Yu et al.

(10) Patent No.: US 12,652,810 B2
(45) Date of Patent: Jun. 9, 2026

(54) INDUCTORS FOR HYBRID BONDING INTERCONNECT ARCHITECTURES

(71) Applicant: Intel Corporation, Santa Clara, CA (US)

(72) Inventors: Qiang Yu, Saratoga, CA (US); Gwang-Soo Kim, Portland, OR (US); Said Rami, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 269 days.

(21) Appl. No.: 17/698,939

(22) Filed: Mar. 18, 2022

(65) Prior Publication Data

US 2023/0299123 A1 Sep. 21, 2023

(51) Int. Cl.
| | |
|---|---|
| *H10D 1/20* | (2025.01) |
| *H10W 20/40* | (2026.01) |
| *H10W 90/00* | (2026.01) |
| *H10W 72/90* | (2026.01) |
| *H10W 80/00* | (2026.01) |

(52) U.S. Cl.
CPC ............ *H10D 1/20* (2025.01); *H10W 20/497* (2026.01); *H10W 90/00* (2026.01); *H10W 72/926* (2026.01); *H10W 72/936* (2026.01); *H10W 72/9445* (2026.01); *H10W 80/701* (2026.01); *H10W 90/792* (2026.01)

(58) Field of Classification Search
CPC ....... H10D 1/20; H01L 23/5227; H01L 24/06; H01L 24/08; H10W 20/497; H10W 90/00; H10W 72/926
See application file for complete search history.

(56) References Cited

U.S. PATENT DOCUMENTS

| | | | | |
|---|---|---|---|---|
| 7,211,638 B2* | 5/2007 | Jayaraman | ........... | C09D 183/04 528/25 |
| 7,387,841 B2* | 6/2008 | Jayaraman | ........... | C09D 183/04 428/447 |

(Continued)

FOREIGN PATENT DOCUMENTS

| | | | | |
|---|---|---|---|---|
| CN | 114203683 A | * | 3/2022 | ................ H10D 1/20 |
| CN | 115528002 A | * | 12/2022 | ........... H01F 41/046 |

(Continued)

OTHER PUBLICATIONS

Elsherbini, Adel, et al. "Enabling Hybrid Bonding on Intel Process." 2021 IEEE International Electron Devices Meeting (IEDM), Dec. 2021, p. 34.3.1-34.3.4. IEEE Xplore, https://doi.org/10.1109/IEDM19574.2021.9720586.

*Primary Examiner* — Laura M Menz
(74) *Attorney, Agent, or Firm* — Alliance IP, LLC

(57) ABSTRACT

In one embodiment, an apparatus includes a first integrated circuit die with metal bonding pads that are co-planar with an external surface of the die and a second integrated circuit die with metal bonding pads that are co-planar with an external surface of the die. The first and second integrated circuit dies are coupled together such that their external surfaces are in contact and the metal pads of the first integrated circuit die are in direct contact with respective metal pads of the second integrated circuit die. The apparatus also includes an inductor formed at least partially by the metal pads of the first integrated circuit die and the metal pads of the second integrated circuit die.

24 Claims, 12 Drawing Sheets

(56) References Cited

U.S. PATENT DOCUMENTS

| | | | | |
|---|---|---|---|---|
| 9,257,399 | B2 * | 2/2016 | Kuang | H01L 23/3192 |
| 10,431,565 | B1 * | 10/2019 | Kim | H01L 25/50 |
| 11,011,461 | B2 * | 5/2021 | Zhang | H01L 23/5227 |
| 11,107,799 | B1 * | 8/2021 | Alapati | H01L 23/36 |
| 11,121,089 | B2 * | 9/2021 | Yu | H10W 70/614 |
| 11,233,088 | B2 * | 1/2022 | Chen | H10F 39/026 |
| 11,270,959 | B2 * | 3/2022 | Darmawikarta | H10W 44/501 |
| 11,495,555 | B2 * | 11/2022 | Deng | H10W 44/501 |
| 11,670,627 | B1 * | 6/2023 | Alapati | H01L 23/36 257/432 |
| 11,721,677 | B2 * | 8/2023 | Zhang | H10D 1/68 257/737 |
| 12,062,631 | B2 * | 8/2024 | Elsherbini | H10D 1/20 |
| 12,100,701 | B1 * | 9/2024 | Alapati | H01L 23/36 |
| 12,224,103 | B2 * | 2/2025 | Marin | H01F 17/0013 |
| 12,336,196 | B2 * | 6/2025 | Bharath | H10D 1/20 |
| 12,417,991 | B2 * | 9/2025 | Wang | H01L 24/80 |
| 2015/0108644 | A1 * | 4/2015 | Kuang | H01L 23/3192 257/777 |
| 2017/0179094 | A1 * | 6/2017 | Min | H01L 23/49827 |
| 2018/0197845 | A1 * | 7/2018 | Min | H01L 23/49827 |
| 2019/0287934 | A1 * | 9/2019 | Deng | H10W 44/501 |
| 2019/0295967 | A1 * | 9/2019 | Darmawikarta | H10W 44/501 |
| 2020/0212020 | A1 * | 7/2020 | Zhang | H10D 1/68 |
| 2021/0280545 | A1 * | 9/2021 | Watanabe | H10W 20/40 |
| 2021/0313283 | A1 * | 10/2021 | Wilson | H01L 23/66 |
| 2021/0391376 | A1 * | 12/2021 | Chen | H10F 39/026 |
| 2022/0093546 | A1 * | 3/2022 | Elsherbini | H10D 1/20 |
| 2022/0122756 | A1 * | 4/2022 | Wolter | H01F 17/0033 |
| 2022/0308284 | A1 * | 9/2022 | Liao | G02B 6/124 |
| 2022/0399150 | A1 * | 12/2022 | Marin | H01F 17/0013 |
| 2022/0415555 | A1 * | 12/2022 | Dogiamis | H01F 27/2804 |
| 2023/0162902 | A1 * | 5/2023 | Ahmed | H01F 27/022 336/90 |
| 2023/0215836 | A1 * | 7/2023 | Haba | H01L 24/08 257/668 |
| 2023/0268300 | A1 * | 8/2023 | Uzoh | H01L 25/0655 257/690 |
| 2023/0299044 | A1 * | 9/2023 | Collins | H01L 24/20 257/659 |
| 2023/0299123 | A1 * | 9/2023 | Yu | H10D 1/20 257/531 |
| 2024/0047417 | A1 * | 2/2024 | Yeh | H01L 25/50 |
| 2024/0087990 | A1 * | 3/2024 | Yang | H01L 23/522 |
| 2024/0103238 | A1 * | 3/2024 | Dabral | G02B 6/428 |
| 2024/0186268 | A1 * | 6/2024 | Uzoh | H01L 23/3157 |
| 2024/0203918 | A1 * | 6/2024 | Wang | H01L 24/80 |
| 2024/0332227 | A1 * | 10/2024 | Uzoh | H01L 24/08 |
| 2024/0332333 | A1 * | 10/2024 | Yang | H01L 24/09 |
| 2024/0339467 | A1 * | 10/2024 | Chung | H10F 39/807 |
| 2024/0339475 | A1 * | 10/2024 | Yang | H10F 39/018 |
| 2024/0347576 | A1 * | 10/2024 | Yang | H01L 23/5225 |
| 2024/0355749 | A1 * | 10/2024 | Ecton | H10W 70/611 |
| 2024/0355768 | A1 * | 10/2024 | Elsherbini | H10D 1/20 |
| 2025/0006674 | A1 * | 1/2025 | Uzoh | H10W 72/90 |
| 2025/0054672 | A1 * | 2/2025 | Strong | H01F 17/0013 |
| 2025/0070085 | A1 * | 2/2025 | Wu | H01L 25/0657 |
| 2025/0112188 | A1 * | 4/2025 | Dogiamis | H01L 23/5386 |
| 2025/0112205 | A1 * | 4/2025 | Majhi | H01L 21/568 |
| 2025/0112210 | A1 * | 4/2025 | Then | H10P 72/74 |
| 2025/0113503 | A1 * | 4/2025 | Butzen | H01L 25/16 |
| 2025/0149433 | A1 * | 5/2025 | Feng | H10W 70/611 |
| 2025/0216607 | A1 * | 7/2025 | Liao | G02B 6/124 |
| 2025/0267927 | A1 * | 8/2025 | Kakara | H10D 10/021 |

FOREIGN PATENT DOCUMENTS

| | | | | | |
|---|---|---|---|---|---|
| CN | 119013777 | A | * | 11/2024 | H01L 25/16 |
| CN | 222088605 | U | * | 11/2024 | H10F 39/809 |
| CN | 119174007 | A | * | 12/2024 | H01L 25/0657 |
| CN | 222261070 | U | * | 12/2024 | H10F 39/8037 |
| CN | 120032970 | A | * | 5/2025 | H02M 1/00 |
| CN | 120528381 | A | * | 8/2025 | H01L 23/66 |
| CN | 120548607 | A | * | 8/2025 | H01L 23/053 |
| DE | 102019109844 | B4 | * | 3/2025 | H03K 19/1776 |
| EP | 3971960 | A1 | * | 3/2022 | H10D 1/20 |
| EP | 4113550 | A1 | * | 1/2023 | H01F 41/046 |
| EP | 4607587 | A1 | * | 8/2025 | H01L 23/66 |
| JP | 2020145284 | A | * | 9/2020 | H01L 24/05 |
| JP | 2021141252 | A | * | 9/2021 | H01L 24/94 |
| JP | 2025500427 | A | * | 1/2025 | H01L 24/08 |
| JP | 2025506818 | A | * | 3/2025 | H01L 25/16 |
| KR | 20220037950 | A | * | 3/2022 | H10D 1/20 |
| KR | 102662501 | B1 | * | 4/2024 | H01L 23/5383 |
| KR | 20240119164 | A | * | 8/2024 | H01L 24/08 |
| KR | 20240156613 | A | * | 10/2024 | H01L 25/50 |
| KR | 20250095448 | A | * | 6/2025 | H01F 17/0006 |
| KR | 20250114543 | A | * | 7/2025 | H01L 23/053 |
| TW | 1859877 | B | * | 10/2024 | H10F 39/8037 |
| TW | 202441775 | A | * | 10/2024 | H10F 39/809 |
| TW | 202442059 | A | * | 10/2024 | H10F 39/8037 |
| WO | WO-2021202074 | A1 | * | 10/2021 | H01L 23/49811 |
| WO | WO-2023018780 | A1 | * | 2/2023 | H01L 25/50 |
| WO | WO-2023122732 | A1 | * | 6/2023 | H01L 24/08 |
| WO | WO-2023164564 | A1 | * | 8/2023 | H01L 25/16 |
| WO | WO-2024091846 | A1 | * | 5/2024 | H10D 1/716 |
| WO | WO-2024118829 | A1 | * | 6/2024 | H01L 23/053 |
| WO | WO-2024137283 | A1 | * | 6/2024 | H01L 25/16 |
| WO | WO-2024206337 | A1 | * | 10/2024 | H01L 24/80 |
| WO | WO-2025006399 | A1 | * | 1/2025 | H01L 24/80 |
| WO | WO-2025071719 | A1 | * | 4/2025 | H01L 23/5389 |

* cited by examiner

900

902

902

1200

PROCESSOR UNIT
1202

COMMUNICATION COMPONENT
1212

MEMORY
1204

BATTERY/POWER
1214

DISPLAY DEVICE
1206

GNSS DEVICE
1218

AUDIO OUTPUT DEVICE
1208

AUDIO INPUT DEVICE
1224

AN OTHER OUTPUT DEVICE
1210

AN OTHER INPUT DEVICE
1220

ANTENNA 1222

INDUCTORS FOR HYBRID BONDING INTERCONNECT ARCHITECTURES

BACKGROUND

Hybrid bonding interconnect (HBI) technology involves a die-to-die interconnect mechanism that replaces micro-bump solder interconnects (e.g., copper pillars capped with solder) at the bonding surface of the die with metal pads that are co-planar with the bonding surface.

DETAILED DESCRIPTION

Figure 1:
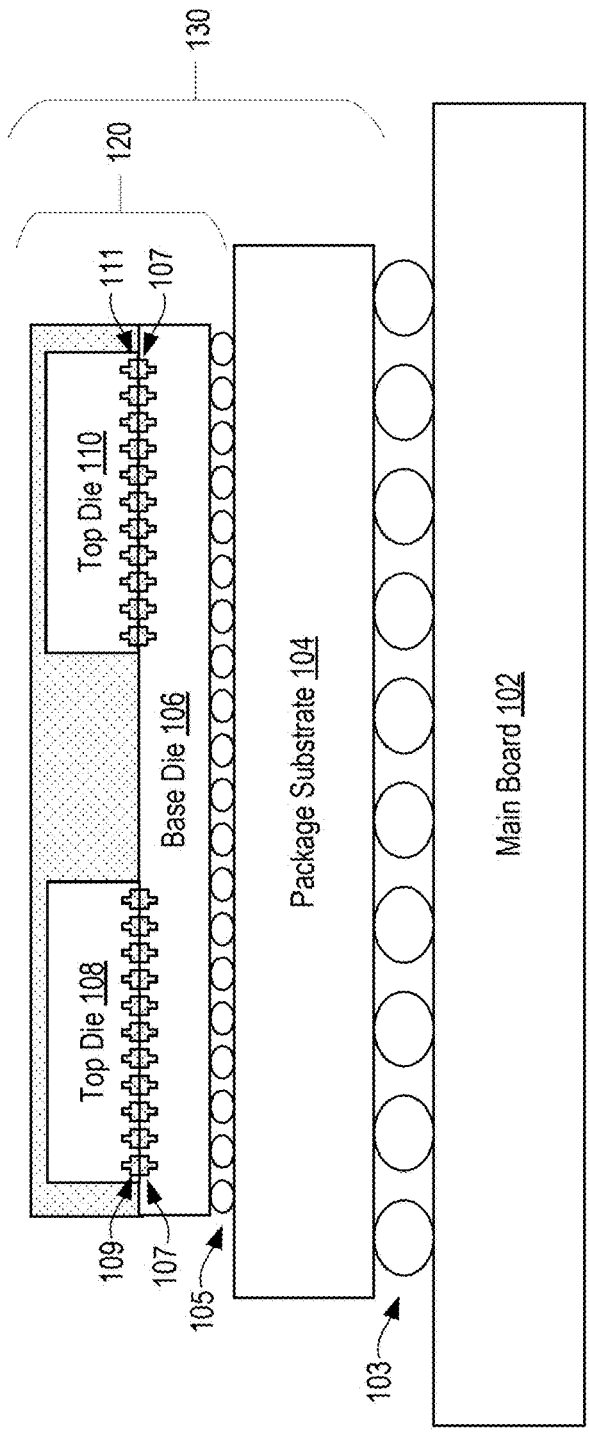
FIG. 1 illustrates an example system that includes a hybrid bonding interconnect (HBI) architecture in accordance with embodiments of the present disclosure.

Hybrid bonding interconnect (HBI) technology involves a die-to-die interconnect mechanism that replaces micro-bump solder interconnects (e.g., copper pillars capped with solder) at the bonding surface of the die with metal pads that are co-planar with the bonding surface. HBI architectures offer higher interconnect density over traditional solder bump interconnects, enabling scalable and higher interconnect density between stacked dies and much more efficient die-to-die interconnect circuits.

Typically, inductors implemented in dies of an HBI architecture are built in the far backend layers of the die, and as such, the inductance, quality factor (Q), and self-resonance frequency (SRF) can decrease due to the loss and capacitance introduced by the additional silicon substrate. In addition, HBI architectures have stringent interface flatness requirements for the surfaces that interface with other dies, since the interconnecting metal pads are co-planar with the surface and imperfections in the flatness could cause misconnections between the dies. The flatness is at least partially defined by the metal density on the bonding surface and keeping the metal density roughly constant over the bonding surface is required to maintain proper connections between the dies. For example, some implementations may require metal density of the metal bonding layer to be controlled uniformly within 20-25%. Unfortunately, this means bonding pads above on-chip inductors cannot be completely de-populated, which can further degrade the inductance, Q, and SRF of the inductors.

To address these or other issues, embodiments herein may involve HBI architectures that include novel inductor designs that are shared between metal layers of two dies in the HBI architecture. In particular, the inductor design may utilize metal of the HBI bonding layers of the dies and/or internal metal layers to implement an inductor. Such inductor designs may involve minimal or no fabrication process changes when compared to current designs.

In some embodiments, for instance, the inductor may be formed by merging adjacent bonding pads of the bonding layer into metal traces while maintaining a similar pad layer density across the bonding layer. The metal traces may be used to form at least part of the inductor coil. The coil may be formed such that the magnetic field passes through the coil in in the vertical direction with respect to the dies (i.e., orthogonal to the co-planar direction of the dies). In some embodiments, additional internal metal layers can be used to form the inductor as well, which can greatly improve inductance density over a particular area of the die(s). For instance, such embodiments can improve the inductance density of the HBI technology may be increased by >2x. Unlike active devices, the area of such inductors does not reduce with technology scaling. For instance, by taking advantage of the additional HBI bonding layer traces, inductance density can be significantly improved, thus reducing the overall area of inductors.

As another example, in some embodiments, the inductor may be formed such that the magnetic field passes through the inductor coil in a direction that is co-planar with the dies. In such embodiments, the self-resonance frequency (SRF) of the HBI technology may be increased by >40%. The improved SRF of such an inductor extends the operating frequency range (since the inductor becomes a capacitor beyond the SRF) for products containing high frequency circuits (e.g., phase locked loops (PLLs), high speed I/O transceivers, etc.).

FIG. 1 illustrates an example system 100 that includes a hybrid bonding interconnect architecture in accordance with embodiments of the present disclosure. The system 100 includes a main board 102, which may be a motherboard, system board, etc., with a package 130 coupled to the main board 102 via solder bumps 103. The main board 102 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the main board 102, e.g., power supplies, voltage regulators, memory devices, or other packages similar to the package 130.

The package 130 includes a package substrate 104 and a multi-die complex 120 coupled to the package substrate 104 via solder bumps 105. The multi-die complex 120 of FIG. 1 may be referred to as an interposer HBI architecture, with the top dies 108, 110 being connected to the base die 106 through bonding pads that are co-planar with the bonding surfaces of the respective dies. For instance, the bonding pads 109 on the bottom surface of the top die 108 connect to a first set of bonding pads 107 on the top surface of the base die 106 and the bonding pads 111 on the bottom surface of the top die 110 connect to a second set of bonding pads 107 on the top surface of the base die 106 without any solder between the bonding pads.

The package substrate 104 may include one or more circuits to interconnect the dies 106, 108, 110 with the main board 102 and/or other components connected to the main board 102. In some embodiments, the package substrate 104 may also include circuitry to interconnect the dies 108, 110 with one another.

Figure 5:
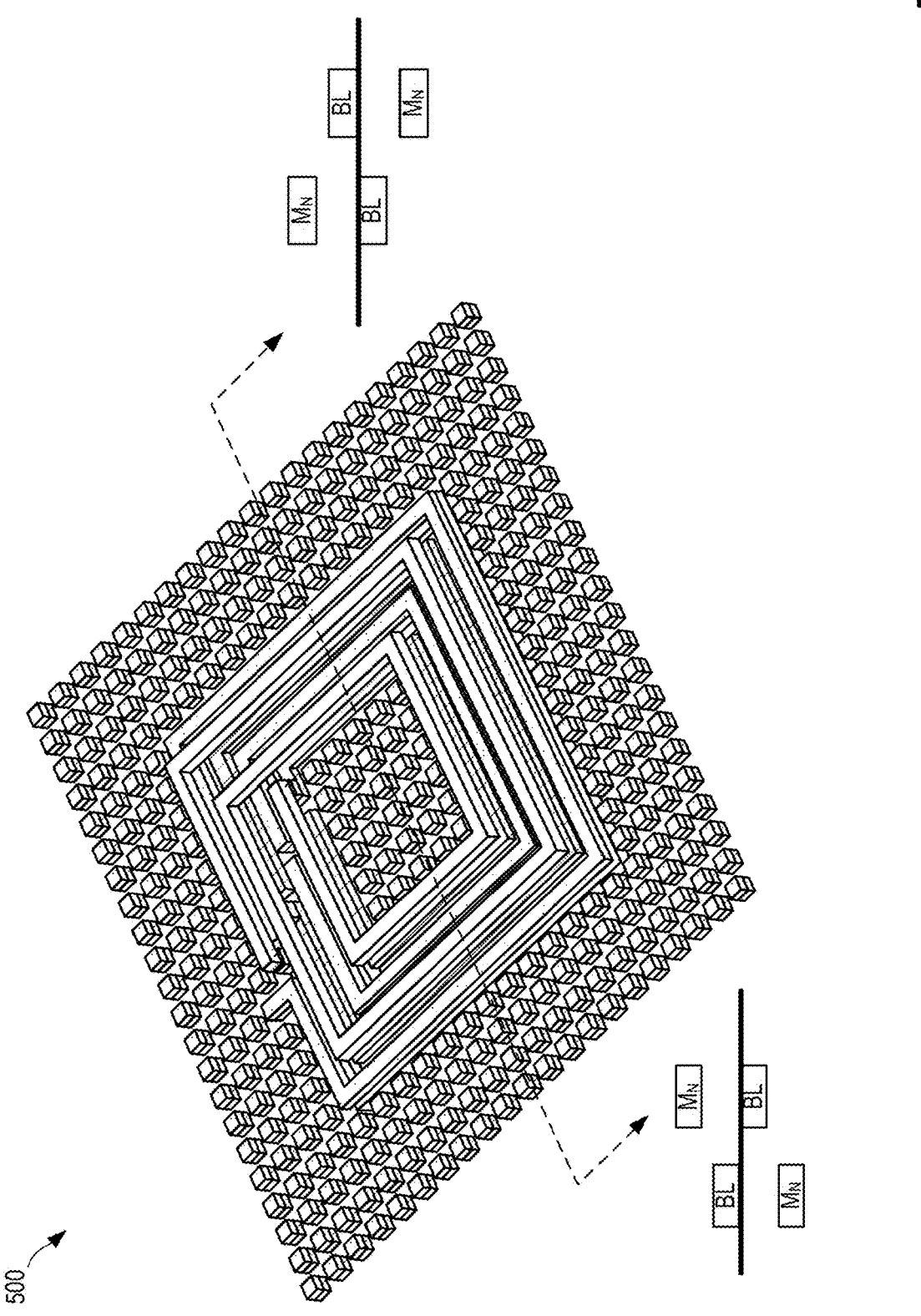
FIG. 5 illustrates an example inductor design in accordance with embodiments of the present disclosure.
Figure 7:
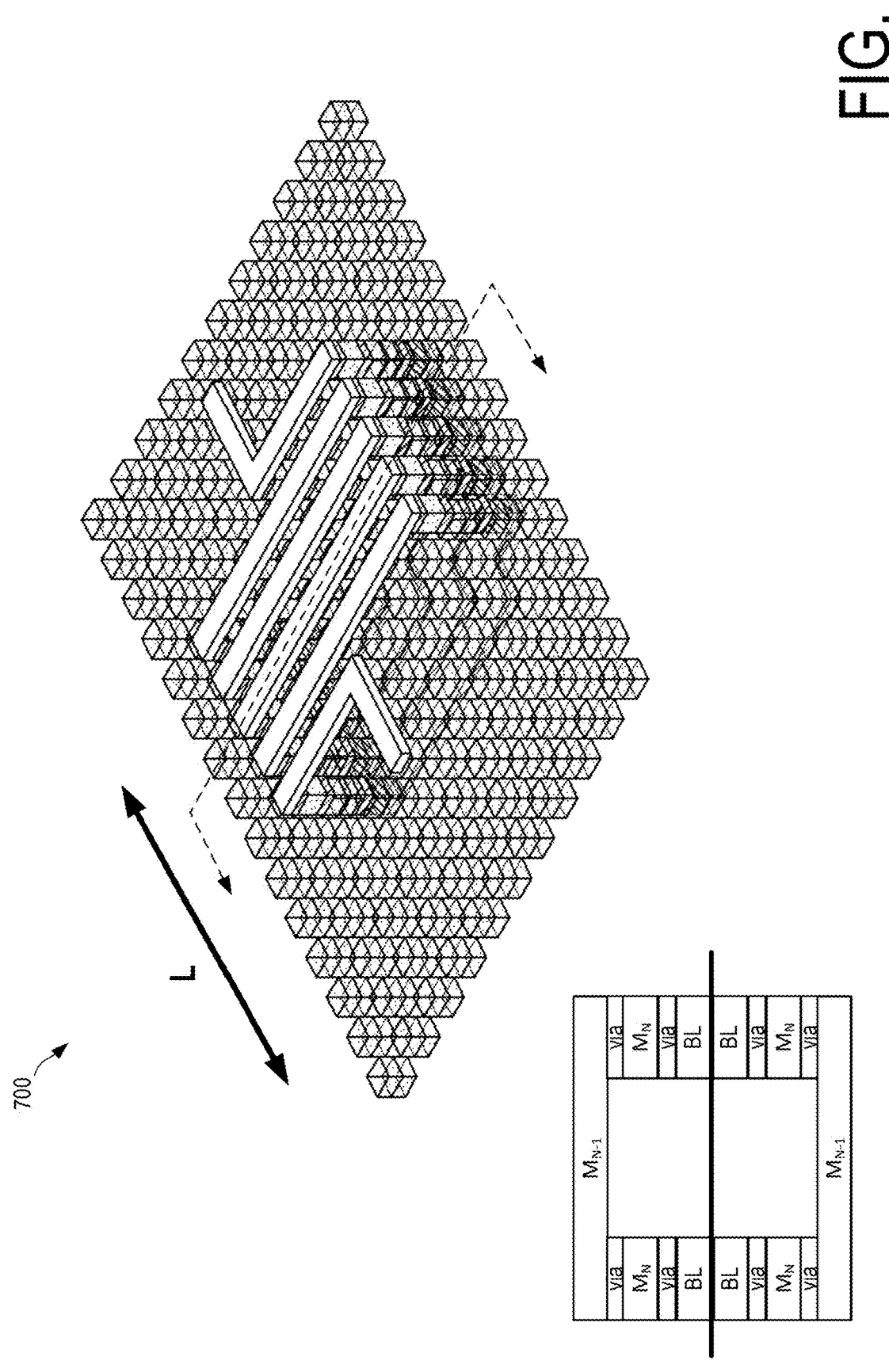
FIG. 7 illustrates another example inductor design in accordance with embodiments of the present disclosure.

As disclosed herein, an inductor may be formed using bonding pads from respective pairs of bonded dies (e.g., from 107 and 109 or from 107 and 111). The inductor may accordingly span between two dies in a multi-die complex. In some embodiments, the inductor may additionally utilize metal layers within the dies. The inductor may be formed such that the magnetic field passes through the inductor coil in a direction that is co-planar with respect to the dies (e.g., in the horizontal direction in the example shown in FIG. 1, i.e., left-to-right or into/out of the page). This may be referred to as a "horizontal inductor" herein. In other instances, the inductor may be designed such that the magnetic field passes through the inductor coil or in a direction that is orthogonal to the co-planar direction (e.g., the vertical direction in the example shown in FIG. 1). This may be referred to as a "vertical inductor" herein. An example vertical inductor design is shown in FIG. 5, while an example horizontal inductor design is shown in FIG. 7, with each example being described further below.

Figure 2A:
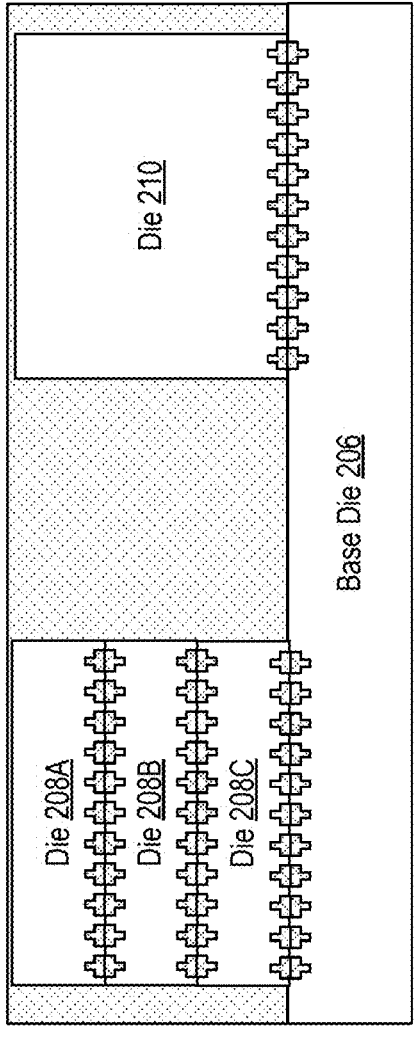
FIGS. 2A-2B illustrate additional examples of multi-die complexes that may be used in a hybrid bonding interconnect (HBI) architecture in accordance with embodiments of the present disclosure.
Figure 2A:
Figure 2B:
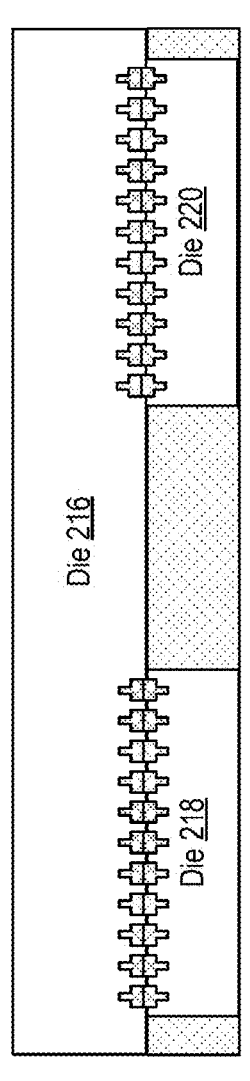
Figure 2B:

FIGS. 2A-2B illustrate additional examples of multi-die complexes 200 that may be used in an HBI architecture in accordance with embodiments of the present disclosure. In particular, FIG. 2A illustrates a stacked die architecture, while FIG. 2B illustrates what may be referred to as an omnidirectional interconnect (ODI) architecture. Either of the example multi-die complexes 200 can be implemented in the system 100 of FIG. 1 in place of, or in addition to, the multi-die complex 120. In the example shown in FIG. 2A, the multi-die complex 200A includes a base die 206 that can couple the multi-die complex 200A to a package substrate (e.g., 104) or to another circuit board. The base die 206 couples a set of stacked dies 208 with another die 210. In contrast, in the example shown in FIG. 2B, the multi-die complex 200B includes two dies 218, 220 that couple the multi-die complex 200B to a package substrate (e.g., 104) or to another circuit board, and another die 216 that interconnects the two dies 218, 220.

Figure 3:
FIG. 3 illustrates an example interface between two dies in an HBI architecture in accordance with embodiments of the present disclosure.

FIG. 3 illustrates an example interface 300 between two dies 310, 320 in a hybrid bonding interconnect (HBI) architecture in accordance with embodiments of the present disclosure. As shown, each die includes a set of internal metal layers (indicated by $M_x$) and a metal bonding layer (indicated by BL). The metal bonding layer includes metal pads with a surface that is co-planar with the bonding surfaces of the respective dies (i.e., the surface of the respective dies that creates the die-to-die interface 300). The metal pads of the bonding layers of the respective dies connect to each other at the interface 300 and connect to one or more of the internal metal layers of the die. In embodiments herein, an inductor may be formed using the bonding layers of each die, and in some embodiments, one or more of the internal metal layers of the die.

Figure 4:
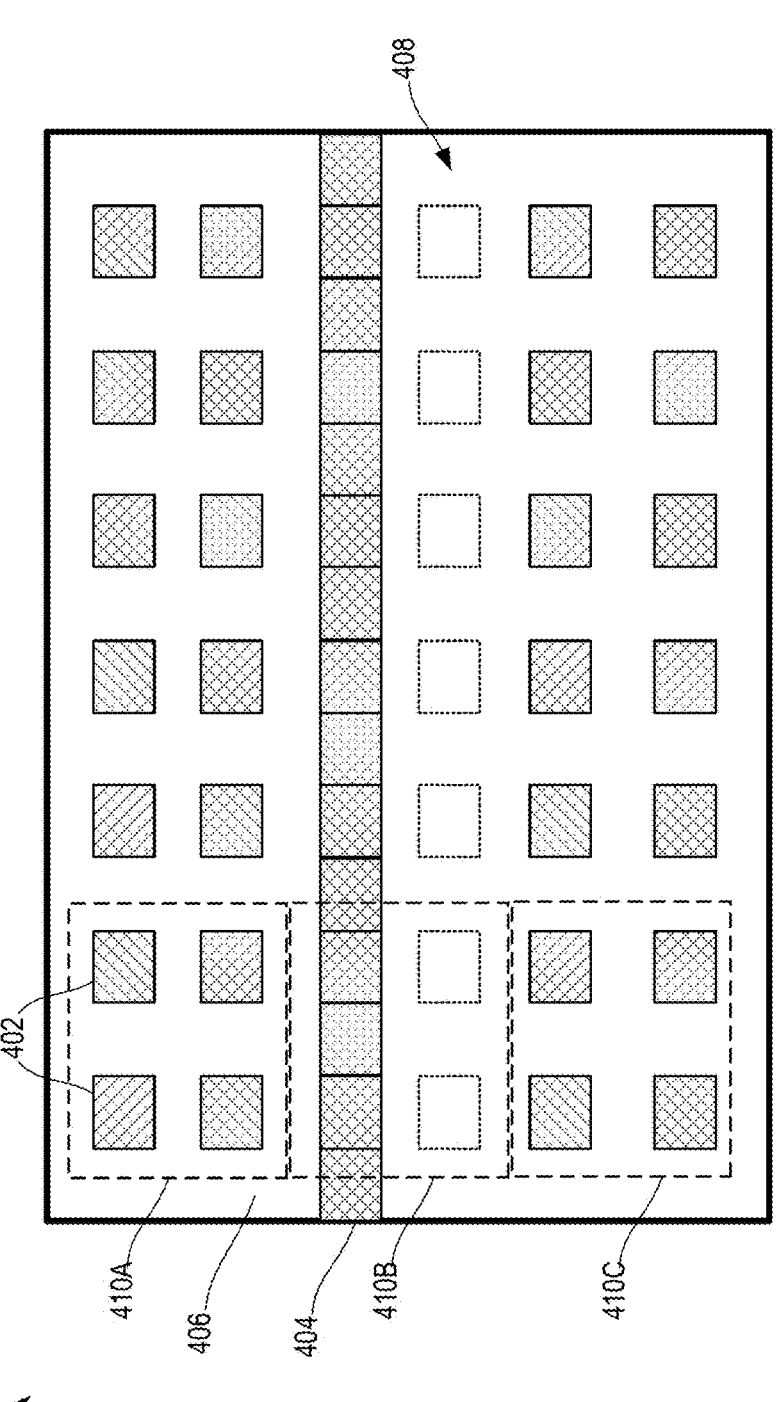
FIG. 4 illustrates a top view of example bonding surface of an HBI-compatible die in accordance with embodiments of the present disclosure.

FIG. 4 illustrates a top view of example bonding surface of an HBI-compatible die in accordance with embodiments of the present disclosure. The bonding surface includes bond pads 402, a trace 404, and a dielectric material 406 as shown. As described above, density of metal on the bonding surface may need to be kept relatively constant over the entirety of the die. As shown in FIG. 4, each of the regions 410 includes the same amount of metal material relative to the dielectric material (approximately 20-25%). This includes the region 410B that includes depopulated pads 408, since the trace 404 adds material in the region in the same proportion that was depopulated.

FIG. 5 illustrates an example inductor design 500 in accordance with embodiments of the present disclosure. The example inductor design 500 may be referred to as a vertical inductor, whereby the magnetic field passes through the inductor coil in the vertical direction. The example inductor is a high density, 8-turn inductor that spans between a first die and a second die. The inductor includes coil winds on each of a first metal layer of the first die ($M_N$), the bonding layer of the first die, the bonding layer of the second die, and a first metal layer of the second die ($M_N$). Similar to the example in FIG. 4, adjacent bonding pads of each die are merged to create traces to form the coil winding, with surrounding bonding pads being depopulated to maintain similar density across the bonding surface of the chips. The bonding pads of the example inductor shown in FIG. 5 are staggered as shown in the cross-sectional views of FIG. 5, e.g., to provide design flexibility and increase inductance density. The staggering can serve to reduce capacitive coupling while maintaining the desired magnetic coupling. Additional internal metal layers from both dies can be used in other embodiments, which can allow for even higher inductance.

The example inductor design 500 takes advantage of the additional metal routing layers, allowing for a ~7 nH on-chip inductor to be realized within a 130 um×130 um space.

Figure 6:
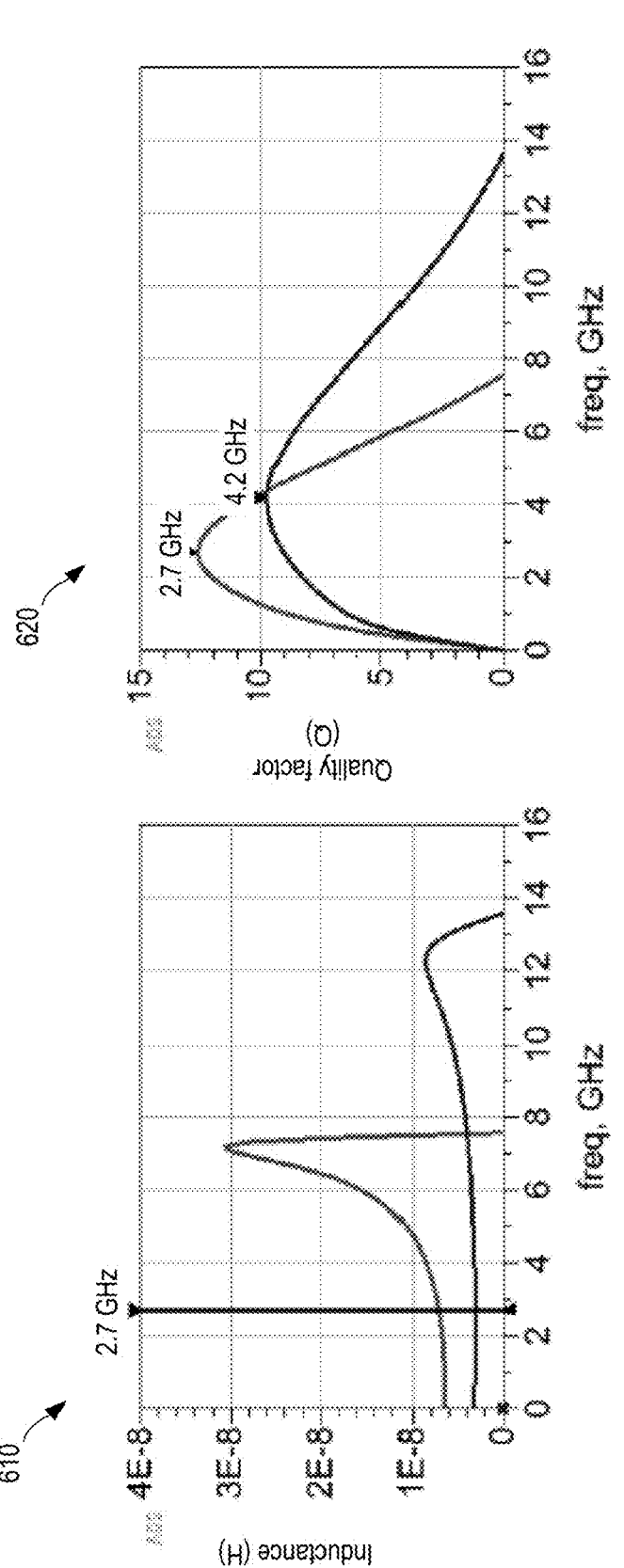
FIG. 6 illustrates example simulation data for the example inductor design of FIG. 5 compared with a similar sized inductor implemented solely within a metal layer of a die.
Figure 6:

FIG. 6 illustrates example simulation data for the example inductor design of FIG. 5 compared with a similar sized inductor implemented solely within a metal layer of a die. As shown in the data of FIG. 6, the example inductor design 500 of FIG. 5 achieves an inductance density that is over 2×higher and has approximately 29.6% higher Q compared to existing inductor designs that only use the internal metal layers in the same 130 um×130 um space. As shown in the chart 610 of FIG. 6, the inductance of the inductor of FIG. 5 is approximately 7.155 nH at 2.7 GHz, while the inductor design using only internal metal layers has an inductance of 3.032 nH at 2.7 GHz. Further, as shown in the chart 620, the maximum value of Q of the inductor of FIG. 5 is approximately 12.622 at 2.7 GHz, while the maximum value of Q of the inductor design using only internal metal layers is approximately 9.736 at 4.2 GHz.

FIG. 7 illustrates another example inductor design 700 in accordance with embodiments of the present disclosure. The example inductor design 700 may be referred to as a horizontal inductor, whereby the magnetic field passes through the inductor coil in the horizontal direction. The example inductor of FIG. 7 is formed using horizontal traces in a second internal metal layer ($M_{N-1}$) of a first die of two bonded dies and horizontal traces in a second internal metal layer ($M_{N-1}$) of a second die of the two bonded dies. The horizontal traces in the first and second dies are connected to vertical traces created by portions of the first metal layers ($M_N$) and the bonding layers of the first and second dies, with vias connecting those portions together. The example inductor design 700 can implement a 0.6 nH inductor with SRF of 76 GHz within a 65 um×55 um area. One advantage of this design is that the magnetic field is parallel to the silicon substrates of the two dies, which reduces the effect of eddy currents and improves the SRF compared with conventional on-chip inductor design. In addition, the surrounding HBI bonding pads do not need to be de-populated, requiring no process change from current solutions.

Figure 8:
FIG. 8 illustrates example simulation data for the example inductor design of FIG. 7 compared with a similar sized inductor implemented solely within a metal layer of a die.
Figure 8:
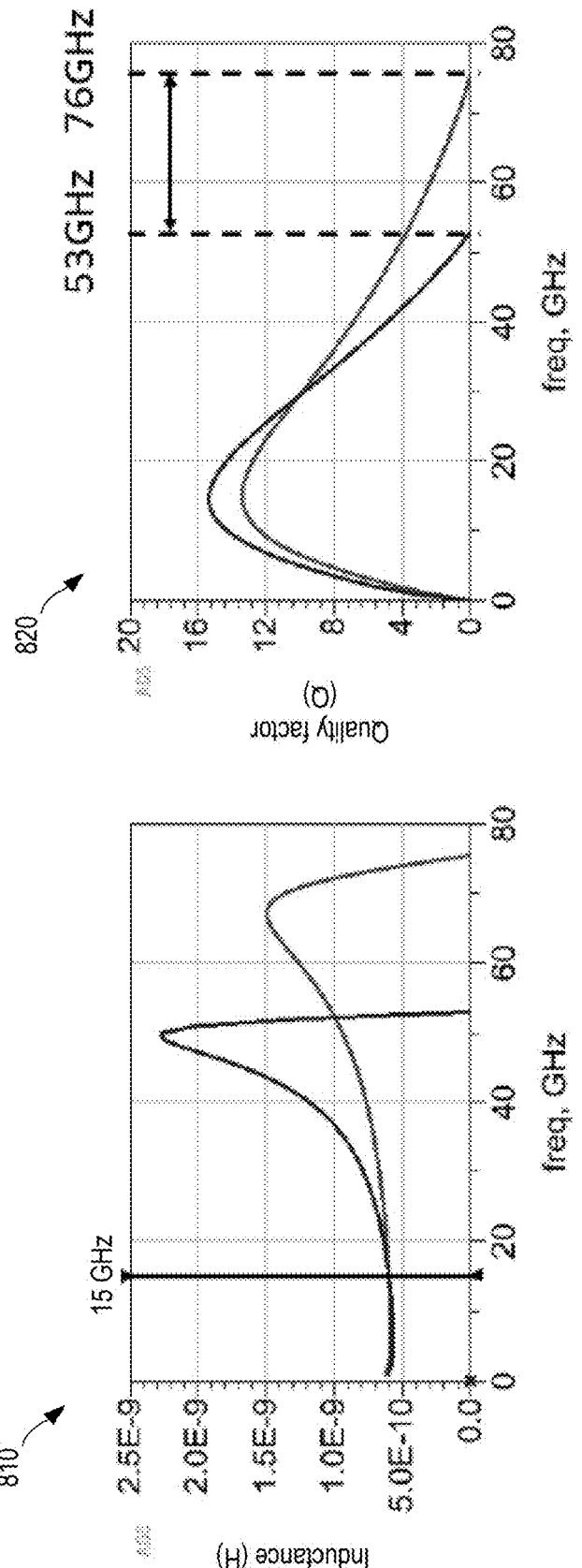

FIG. 8 illustrates example simulation data for the example inductor design of FIG. 7 compared with a similar sized inductor implemented solely within a metal layer of a die. As shown in the chart 810 of FIG. 8, the inductor design 700 of FIG. 7 has a similar inductance value at lower frequencies (e.g., 15 GHz and below) as inductor designs over the same area using only internal metal layers. Further, as shown in the chart 820 of FIG. 8, when compared with inductor designs over the same area using only internal metal layers, the inductor design 700 of FIG. 7 achieves a similar Q but with an increased SRF (i.e., shown by the increased max frequency from 53 GHz to 76 GHz).

Figure 9:
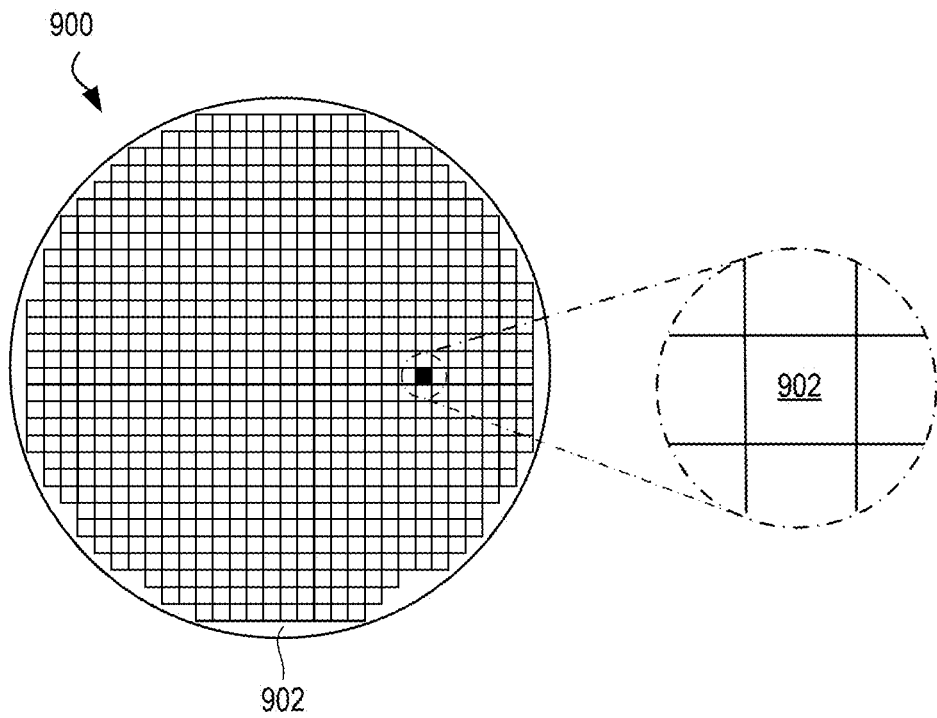
FIG. 9 is a top view of a wafer and dies that may be included in a microelectronic assembly, in accordance with any of the embodiments disclosed herein.

FIG. 9 is a top view of a wafer 900 and dies 902 that may incorporate any of the embodiments disclosed herein. The wafer 900 may be composed of semiconductor material and may include one or more dies 902 having integrated circuit structures formed on a surface of the wafer 900. The individual dies 902 may be a repeating unit of an integrated circuit product that includes any suitable integrated circuit. After the fabrication of the semiconductor product is complete, the wafer 900 may undergo a singulation process in which the dies 902 are separated from one another to provide discrete "chips" of the integrated circuit product. The die 902 may include one or more transistors (e.g., some of the transistors 1040 of FIG. 10, discussed below), supporting circuitry to route electrical signals to the transistors, passive components (e.g., signal traces, resistors, capacitors, or inductors), and/or any other integrated circuit components. In some embodiments, the wafer 900 or the die 902 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 902. For example, a memory array formed by multiple memory devices may be formed on a same die 902 as a processor unit (e.g., the processor unit 1202 of FIG. 12) or other logic that is configured to store information in the memory devices or execute instructions stored in the memory array.

Figure 10:
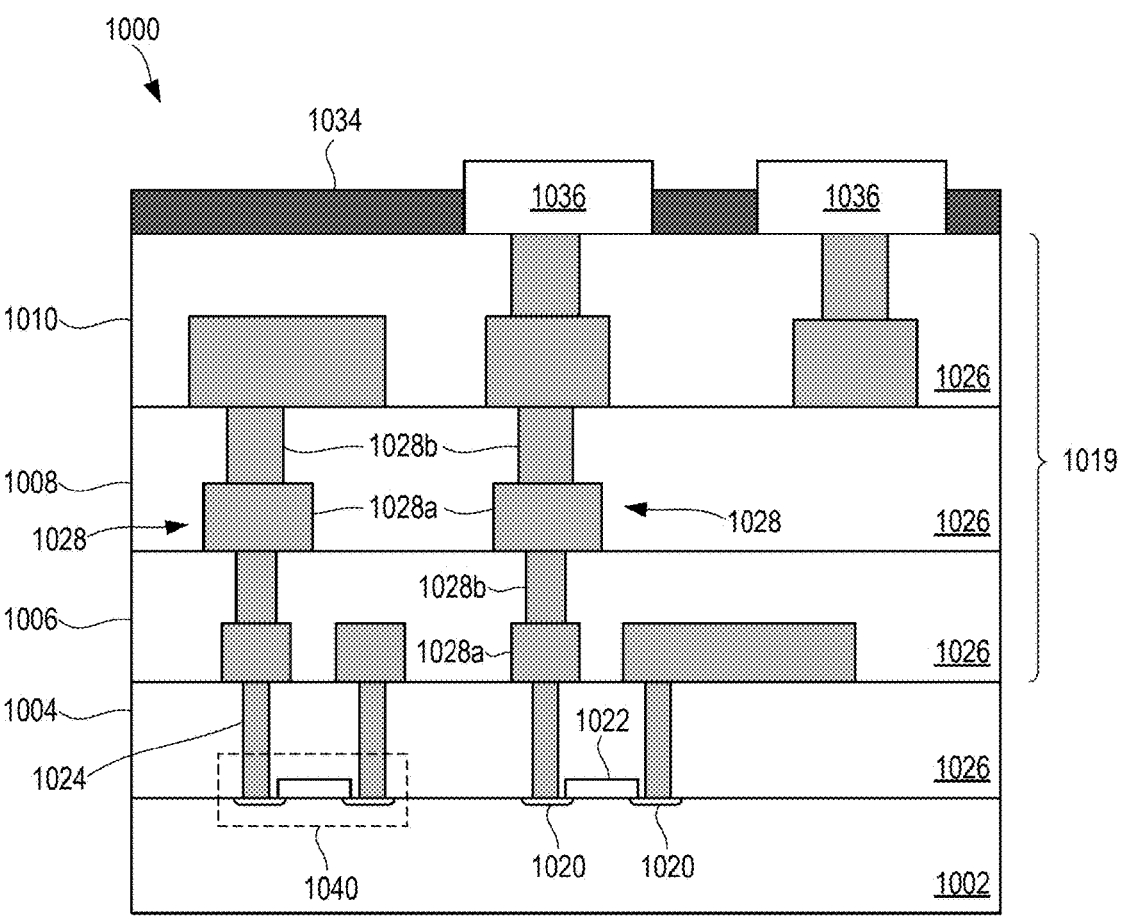
FIG. 10 is a cross-sectional side view of an integrated circuit device that may be included in a microelectronic assembly, in accordance with any of the embodiments disclosed herein.

FIG. 10 is a cross-sectional side view of an integrated circuit device 1000 that may be included in any of the embodiments disclosed herein. One or more of the integrated circuit devices 1000 may be included in one or more dies 902 (FIG. 9). The integrated circuit device 1000 may be formed on a die substrate 1002 (e.g., the wafer 900 of FIG. 9) and may be included in a die (e.g., the die 902 of FIG. 9). The die substrate 1002 may be a semiconductor substrate composed of semiconductor material systems including, for example, n-type or p-type materials systems (or a combination of both). The die substrate 1002 may include, for example, a crystalline substrate formed using a bulk silicon or a silicon-on-insulator (SOI) substructure. In some embodiments, the die substrate 1002 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1002. Although a few examples of materials from which the die substrate 1002 may be formed are described here, any material that may serve as a foundation for an integrated circuit device 1000 may be used. The die substrate 1002 may be part of a singulated die (e.g., the dies 902 of FIG. 9) or a wafer (e.g., the wafer 900 of FIG. 9).

The integrated circuit device 1000 may include one or more device layers 1004 disposed on the die substrate 1002. The device layer 1004 may include features of one or more transistors 1040 (e.g., metal oxide semiconductor field-effect transistors (MOSFETs)) formed on the die substrate 1002. The transistors 1040 may include, for example, one or more source and/or drain (S/D) regions 1020, a gate 1022 to control current flow between the S/D regions 1020, and one or more S/D contacts 1024 to route electrical signals to/from the S/D regions 1020. The transistors 1040 may include additional features not depicted for the sake of clarity, such as device isolation regions, gate contacts, and the like. The transistors 1040 are not limited to the type and configuration depicted in FIG. 10 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Returning to FIG. 10, a transistor 1040 may include a gate 1022 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1040 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1040 along the source-channel-drain direction, the gate electrode may consist of a U-shaped structure that includes a bottom portion substantially parallel to the surface of the die substrate 1002 and two sidewall portions that are substantially perpendicular to the top surface of the die substrate 1002. In other embodiments, at least one of the metal layers that form the gate electrode may simply be a planar layer that is substantially parallel to the top surface of the die substrate 1002 and does not include sidewall portions substantially perpendicular to the top surface of the die substrate 1002. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1020 may be formed within the die substrate 1002 adjacent to the gate 1022 of individual transistors 1040. The S/D regions 1020 may be formed using an implantation/diffusion process or an etching/deposition process, for example. In the former process, dopants such as boron, aluminum, antimony, phosphorous, or arsenic may be ion-implanted into the die substrate 1002 to form the S/D regions 1020. An annealing process that activates the dopants and causes them to diffuse farther into the die substrate 1002 may follow the ion-implantation process. In the latter process, the die substrate 1002 may first be etched to form recesses at the locations of the S/D regions 1020. An epitaxial deposition process may then be carried out to fill the recesses with material that is used to fabricate the S/D regions 1020. In some implementations, the S/D regions 1020 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1020 may be formed using one or more alternate semiconductor materials such as germanium or a group III-V material or alloy. In further embodiments, one or more layers of metal and/or metal alloys may be used to form the S/D regions 1020.

Electrical signals, such as power and/or input/output (I/O) signals, may be routed to and/or from the devices (e.g., transistors 1040) of the device layer 1004 through one or more interconnect layers disposed on the device layer 1004 (illustrated in FIG. 10 as interconnect layers 1006-1010). For example, electrically conductive features of the device layer 1004 (e.g., the gate 1022 and the S/D contacts 1024) may be electrically coupled with the interconnect structures 1028 of the interconnect layers 1006-1010. The one or more interconnect layers 1006-1010 may form a metallization stack (also referred to as an "ILD stack") 1019 of the integrated circuit device 1000.

The interconnect structures 1028 may be arranged within the interconnect layers 1006-1010 to route electrical signals according to a wide variety of designs; in particular, the arrangement is not limited to the particular configuration of interconnect structures 1028 depicted in FIG. 10. Although a particular number of interconnect layers 1006-1010 is depicted in FIG. 10, embodiments of the present disclosure include integrated circuit devices having more or fewer interconnect layers than depicted.

In some embodiments, the interconnect structures 1028 may include lines 1028a and/or vias 1028b filled with an electrically conductive material such as a metal. The lines 1028a may be arranged to route electrical signals in a direction of a plane that is substantially parallel with a surface of the die substrate 1002 upon which the device layer 1004 is formed. For example, the lines 1028a may route electrical signals in a direction in and out of the page and/or in a direction across the page from the perspective of FIG. 10. The vias 1028b may be arranged to route electrical signals in a direction of a plane that is substantially perpendicular to the surface of the die substrate 1002 upon which the device layer 1004 is formed. In some embodiments, the vias 1028b may electrically couple lines 1028a of different interconnect layers 1006-1010 together.

The interconnect layers 1006-1010 may include a dielectric material 1026 disposed between the interconnect structures 1028, as shown in FIG. 10. In some embodiments, dielectric material 1026 disposed between the interconnect structures 1028 in different ones of the interconnect layers 1006-1010 may have different compositions; in other embodiments, the composition of the dielectric material 1026 between different interconnect layers 1006-1010 may be the same. The device layer 1004 may include a dielectric material 1026 disposed between the transistors 1040 and a bottom layer of the metallization stack as well. The dielectric material 1026 included in the device layer 1004 may have a different composition than the dielectric material 1026 included in the interconnect layers 1006-1010; in other embodiments, the composition of the dielectric material 1026 in the device layer 1004 may be the same as a dielectric material 1026 included in any one of the interconnect layers 1006-1010.

A first interconnect layer 1006 (referred to as Metal 1 or "M1") may be formed directly on the device layer 1004. In some embodiments, the first interconnect layer 1006 may include lines 1028a and/or vias 1028b, as shown. The lines 1028a of the first interconnect layer 1006 may be coupled with contacts (e.g., the S/D contacts 1024) of the device layer 1004. The vias 1028b of the first interconnect layer 1006 may be coupled with the lines 1028a of a second interconnect layer 1008.

The second interconnect layer 1008 (referred to as Metal 2 or "M2") may be formed directly on the first interconnect layer 1006. In some embodiments, the second interconnect layer 1008 may include via 1028b to couple the lines 1028 of the second interconnect layer 1008 with the lines 1028a of a third interconnect layer 1010. Although the lines 1028a and the vias 1028b are structurally delineated with a line within individual interconnect layers for the sake of clarity, the lines 1028a and the vias 1028b may be structurally and/or materially contiguous (e.g., simultaneously filled during a dual-damascene process) in some embodiments.

The third interconnect layer 1010 (referred to as Metal 3 or "M3") (and additional interconnect layers, as desired)

may be formed in succession on the second interconnect layer 1008 according to similar techniques and configurations described in connection with the second interconnect layer 1008 or the first interconnect layer 1006. In some embodiments, the interconnect layers that are "higher up" in the metallization stack 1019 in the integrated circuit device 1000 (i.e., farther away from the device layer 1004) may be thicker that the interconnect layers that are lower in the metallization stack 1019, with lines 1028*a* and vias 1028*b* in the higher interconnect layers being thicker than those in the lower interconnect layers.

The integrated circuit device 1000 may include a solder resist material 1034 (e.g., polyimide or similar material) and one or more conductive contacts 1036 formed on the interconnect layers 1006-1010. In FIG. 10, the conductive contacts 1036 are illustrated as taking the form of bond pads. The conductive contacts 1036 may be electrically coupled with the interconnect structures 1028 and configured to route the electrical signals of the transistor(s) 1040 to external devices. For example, solder bonds may be formed on the one or more conductive contacts 1036 to mechanically and/or electrically couple an integrated circuit die including the integrated circuit device 1000 with another component (e.g., a printed circuit board). The integrated circuit device 1000 may include additional or alternate structures to route the electrical signals from the interconnect layers 1006-1010; for example, the conductive contacts 1036 may include other analogous features (e.g., posts) that route the electrical signals to external components.

In some embodiments in which the integrated circuit device 1000 is a double-sided die, the integrated circuit device 1000 may include another metallization stack (not shown) on the opposite side of the device layer(s) 1004. This metallization stack may include multiple interconnect layers as discussed above with reference to the interconnect layers 1006-1010, to provide conductive pathways (e.g., including conductive lines and vias) between the device layer(s) 1004 and additional conductive contacts (not shown) on the opposite side of the integrated circuit device 1000 from the conductive contacts 1036.

In other embodiments in which the integrated circuit device 1000 is a double-sided die, the integrated circuit device 1000 may include one or more through silicon vias (TSVs) through the die substrate 1002; these TSVs may make contact with the device layer(s) 1004, and may provide conductive pathways between the device layer(s) 1004 and additional conductive contacts (not shown) on the opposite side of the integrated circuit device 1000 from the conductive contacts 1036. In some embodiments, TSVs extending through the substrate can be used for routing power and ground signals from conductive contacts on the opposite side of the integrated circuit device 1000 from the conductive contacts 1036 to the transistors 1040 and any other components integrated into the die 1000, and the metallization stack 1019 can be used to route I/O signals from the conductive contacts 1036 to transistors 1040 and any other components integrated into the die 1000.

Multiple integrated circuit devices 1000 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 11:
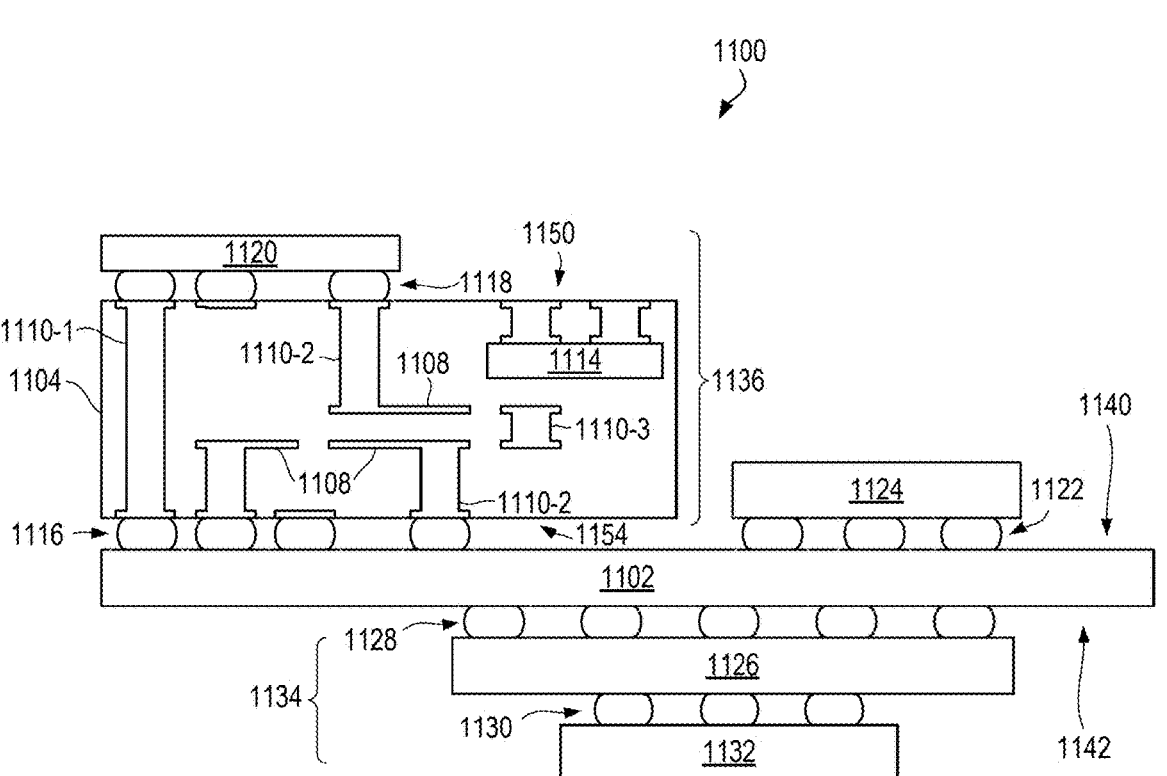
FIG. 11 is a cross-sectional side view of an integrated circuit device assembly that may include a microelectronic assembly, in accordance with any of the embodiments disclosed herein.

FIG. 11 is a cross-sectional side view of an integrated circuit device assembly 1100 that may include any of the embodiments disclosed herein. The integrated circuit device assembly 1100 includes a number of components disposed on a circuit board 1102 (which may be a motherboard, system board, mainboard, etc.). The integrated circuit device assembly 1100 includes components disposed on a first face 1140 of the circuit board 1102 and an opposing second face 1142 of the circuit board 1102; generally, components may be disposed on one or both faces 1140 and 1142.

In some embodiments, the circuit board 1102 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1102. In other embodiments, the circuit board 1102 may be a non-PCB substrate. The integrated circuit device assembly 1100 illustrated in FIG. 11 includes a package-on-interposer structure 1136 coupled to the first face 1140 of the circuit board 1102 by coupling components 1116. The coupling components 1116 may electrically and mechanically couple the package-on-interposer structure 1136 to the circuit board 1102, and may include solder balls (as shown in FIG. 11), pins (e.g., as part of a pin grid array (PGA)), contacts (e.g., as part of a land grid array (LGA)), male and female portions of a socket, an adhesive, an underfill material, and/or any other suitable electrical and/or mechanical coupling structure.

The package-on-interposer structure 1136 may include an integrated circuit component 1120 coupled to an interposer 1104 by coupling components 1118. The coupling components 1118 may take any suitable form for the application, such as the forms discussed above with reference to the coupling components 1116. Although a single integrated circuit component 1120 is shown in FIG. 11, multiple integrated circuit components may be coupled to the interposer 1104; indeed, additional interposers may be coupled to the interposer 1104. The interposer 1104 may provide an intervening substrate used to bridge the circuit board 1102 and the integrated circuit component 1120.

The integrated circuit component 1120 may be a packaged or unpacked integrated circuit product that includes one or more integrated circuit dies (e.g., the die 902 of FIG. 9, the integrated circuit device 1000 of FIG. 10) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1120, a single monolithic integrated circuit die comprises solder bumps attached to contacts on the die. The solder bumps allow the die to be directly attached to the interposer 1104. The integrated circuit component 1120 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1120 can comprise one or more additional active or passive devices such as capacitors, decoupling capacitors, resistors, inductors, fuses, diodes, transformers, sensors, electrostatic discharge (ESD) devices and memory devices.

In embodiments where the integrated circuit component 1120 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1120 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1104 may spread connections to a wider pitch or reroute a connection to a different connection. For example, the interposer 1104 may couple the integrated circuit component 1120 to a set of ball grid array (BGA) conductive contacts of the coupling components 1116 for coupling to the circuit board 1102. In the embodiment illustrated in FIG. 11, the integrated circuit component 1120 and the circuit board 1102 are attached to opposing sides of the interposer 1104; in other embodiments, the integrated circuit component 1120 and the circuit board 1102 may be attached to a same side of the interposer 1104. In some embodiments, three or more components may be interconnected by way of the interposer 1104.

In some embodiments, the interposer 1104 may be formed as a PCB, including multiple metal layers separated from one another by layers of dielectric material and interconnected by electrically conductive vias. In some embodiments, the interposer 1104 may be formed of an epoxy resin, a fiberglass-reinforced epoxy resin, an epoxy resin with inorganic fillers, a ceramic material, or a polymer material such as polyimide. In some embodiments, the interposer 1104 may be formed of alternate rigid or flexible materials that may include the same materials described above for use in a semiconductor substrate, such as silicon, germanium, and other group III-V and group IV materials. The interposer 1104 may include metal interconnects 1108 and vias 1110, including but not limited to through hole vias 1110-1 (that extend from a first face 1150 of the interposer 1104 to a second face 1154 of the interposer 1104), blind vias 1110-2 (that extend from the first or second faces 1150 or 1154 of the interposer 1104 to an internal metal layer), and buried vias 1110-3 (that connect internal metal layers).

In some embodiments, the interposer 1104 can comprise a silicon interposer. Through silicon vias (TSV) extending through the silicon interposer can connect connections on a first face of a silicon interposer to an opposing second face of the silicon interposer. In some embodiments, an interposer 1104 comprising a silicon interposer can further comprise one or more routing layers to route connections on a first face of the interposer 1104 to an opposing second face of the interposer 1104.

The interposer 1104 may further include embedded devices 1114, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1104. The package-on-interposer structure 1136 may take the form of any of the package-on-interposer structures known in the art. In embodiments where the interposer is a non-printed circuit board The integrated circuit device assembly 1100 may include an integrated circuit component 1124 coupled to the first face 1140 of the circuit board 1102 by coupling components 1122. The coupling components 1122 may take the form of any of the embodiments discussed above with reference to the coupling components 1116, and the integrated circuit component 1124 may take the form of any of the embodiments discussed above with reference to the integrated circuit component 1120.

The integrated circuit device assembly 1100 illustrated in FIG. 11 includes a package-on-package structure 1134 coupled to the second face 1142 of the circuit board 1102 by coupling components 1128. The package-on-package structure 1134 may include an integrated circuit component 1126 and an integrated circuit component 1132 coupled together by coupling components 1130 such that the integrated circuit component 1126 is disposed between the circuit board 1102 and the integrated circuit component 1132. The coupling components 1128 and 1130 may take the form of any of the embodiments of the coupling components 1116 discussed above, and the integrated circuit components 1126 and 1132 may take the form of any of the embodiments of the integrated circuit component 1120 discussed above. The package-on-package structure 1134 may be configured in accordance with any of the package-on-package structures known in the art.

Figure 12:
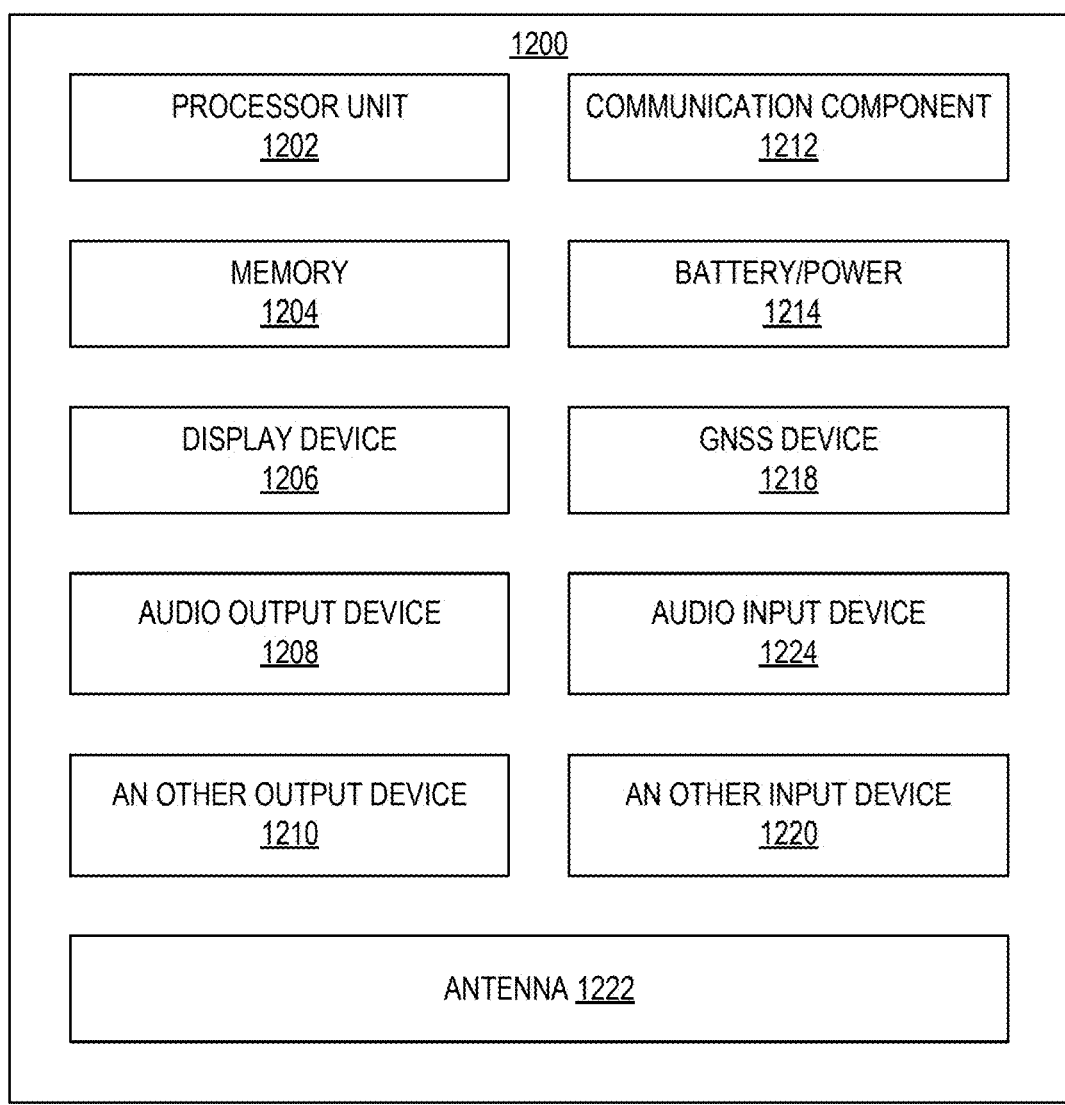
FIG. 12 is a block diagram of an example electrical device that may include a microelectronic assembly, in accordance with any of the embodiments disclosed herein.

FIG. 12 is a block diagram of an example electrical device 1200 that may include one or more of the embodiments disclosed herein. For example, any suitable ones of the components of the electrical device 1200 may include one or more of the integrated circuit device assemblies 1100, integrated circuit components 1120, integrated circuit devices 1000, or integrated circuit dies 902 disclosed herein. A number of components are illustrated in FIG. 12 as included in the electrical device 1200, but any one or more of these components may be omitted or duplicated, as suitable for the application. In some embodiments, some or all of the components included in the electrical device 1200 may be attached to one or more motherboards mainboards, or system boards. In some embodiments, one or more of these components are fabricated onto a single system-on-a-chip (SoC) die.

Additionally, in various embodiments, the electrical device 1200 may not include one or more of the components illustrated in FIG. 12, but the electrical device 1200 may include interface circuitry for coupling to the one or more components. For example, the electrical device 1200 may not include a display device 1206, but may include display device interface circuitry (e.g., a connector and driver circuitry) to which a display device 1206 may be coupled. In another set of examples, the electrical device 1200 may not include an audio input device 1224 or an audio output device 1208, but may include audio input or output device interface circuitry (e.g., connectors and supporting circuitry) to which an audio input device 1224 or audio output device 1208 may be coupled.

The electrical device 1200 may include one or more processor units 1202 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1202 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1200 may include a memory 1204, which may itself include one or more memory devices such as volatile memory (e.g., dynamic random access memory (DRAM), static random-access memory (SRAM)), nonvolatile memory (e.g., read-only memory (ROM), flash memory, chalcogenide-based phase-change non-voltage memories), solid state memory, and/or a hard drive. In some embodiments, the memory 1204 may include memory that is located on the same integrated circuit die as the processor unit 1202. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1200 can comprise one or more processor units 1202 that are heterogeneous or asymmetric to another processor unit 1202 in the electrical device 1200. There can be a variety of differences between the processing units 1202 in a system in terms of a spectrum of metrics of merit including architectural, microarchitectural, thermal, power consumption characteristics, and the like. These differences can effectively manifest themselves as asymmetry and heterogeneity among the processor units 1202 in the electrical device 1200.

In some embodiments, the electrical device 1200 may include a communication component 1212 (e.g., one or more communication components). For example, the communication component 1212 can manage wireless communications for the transfer of data to and from the electrical device 1200. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1212 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1212 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1212 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1212 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1212 may operate in accordance with other wireless protocols in other embodiments. The electrical device 1200 may include an antenna 1222 to facilitate wireless communications and/or to receive other wireless communications (such as AM or FM radio transmissions).

In some embodiments, the communication component 1212 may manage wired communications, such as electrical, optical, or any other suitable communication protocols (e.g., IEEE 802.3 Ethernet standards). As noted above, the communication component 1212 may include multiple communication components. For instance, a first communication component 1212 may be dedicated to shorter-range wireless communications such as Wi-Fi or Bluetooth, and a second communication component 1212 may be dedicated to longer-range wireless communications such as global positioning system (GPS), EDGE, GPRS, CDMA, WiMAX, LTE, EV-DO, or others. In some embodiments, a first communication component 1212 may be dedicated to wireless communications, and a second communication component 1212 may be dedicated to wired communications.

The electrical device 1200 may include battery/power circuitry 1214. The battery/power circuitry 1214 may include one or more energy storage devices (e.g., batteries or capacitors) and/or circuitry for coupling components of the electrical device 1200 to an energy source separate from the electrical device 1200 (e.g., AC line power).

The electrical device 1200 may include a display device 1206 (or corresponding interface circuitry, as discussed above). The display device 1206 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1200 may include an audio output device 1208 (or corresponding interface circuitry, as discussed above). The audio output device 1208 may include any embedded or wired or wirelessly connected external device that generates an audible indicator, such speakers, headsets, or earbuds.

The electrical device 1200 may include an audio input device 1224 (or corresponding interface circuitry, as discussed above). The audio input device 1224 may include any embedded or wired or wirelessly connected device that generates a signal representative of a sound, such as microphones, microphone arrays, or digital instruments (e.g., instruments having a musical instrument digital interface (MIDI) output). The electrical device 1200 may include a Global Navigation Satellite System (GNSS) device 1218 (or corresponding interface circuitry, as discussed above), such as a Global Positioning System (GPS) device. The GNSS device 1218 may be in communication with a satellite-based system and may determine a geolocation of the electrical device 1200 based on information received from one or more GNSS satellites, as known in the art.

The electrical device 1200 may include another output device 1210 (or corresponding interface circuitry, as discussed above). Examples of the other output device 1210 may include an audio codec, a video codec, a printer, a wired or wireless transmitter for providing information to other devices, or an additional storage device.

The electrical device 1200 may include another input device 1220 (or corresponding interface circuitry, as discussed above). Examples of the other input device 1220 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1200 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1200 may be any other electronic device that processes data. In some embodiments, the electrical device 1200 may comprise multiple discrete physical components. Given the range of devices that the electrical device 1200 can be manifested as in various embodiments, in some embodiments, the electrical device 1200 can be referred to as a computing device or a computing system.

Illustrative examples of the technologies described throughout this disclosure are provided below. Embodiments of these technologies may include any one or more, and any combination of, the examples described below. In some embodiments, at least one of the systems or components set forth in one or more of the preceding figures may be configured to perform one or more operations, techniques, processes, and/or methods as set forth in the following examples.

Example 1 is a multi-die apparatus comprising: a first integrated circuit die comprising metal bonding pads that are co-planar with an external surface of the die; a second integrated circuit die comprising metal bonding pads that are co-planar with an external surface of the die, wherein the second integrated circuit die is coupled to the first integrated circuit die such that the external surface of the first integrated circuit die is in contact with the external surface of the second integrated circuit die and the metal pads of the first integrated circuit die are in direct contact with respective metal pads of the second integrated circuit die; and an inductor formed at least partially by the metal pads of the first integrated circuit die and the metal pads of the second integrated circuit die.

Example 2 includes the subject matter of Example 1, wherein the inductor comprises one or more coils arranged to produce a magnetic field orthogonal to the external surfaces of the integrated circuit dies.

Example 3 includes the subject matter of Example 1 or 2, wherein: the first integrated circuit die comprises traces that are co-planar with the external surface of the die; the second integrated circuit die comprises traces that are co-planar with the external surface of the die; and the inductor is further formed at least partially by the traces of the first integrated circuit die that are co-planar with the external surface of the first integrated circuit die and the traces of the second integrated circuit die that are co-planar with the external surface of the second integrated circuit die.

Example 4 includes the subject matter of Example 3, wherein the traces of the first integrated circuit die that are co-planar with the external surface of the first integrated circuit die are not in contact with the traces of the second integrated circuit die that are co-planar with the external surface of the second integrated circuit die.

Example 5 includes the subject matter of Example 1, wherein the inductor comprises one or more coils arranged to produce a magnetic field co-planar with the external surfaces of the integrated circuit dies.

Example 6 includes the subject matter of any one of Examples 1-5, wherein: the first integrated circuit die comprises internal metal layers; the second integrated circuit die comprises internal metal layers; and the inductor is further formed at least partially by traces in the internal metal layers of the first integrated circuit die and traces in the internal metal layers of the second integrated circuit die.

Example 7 includes the subject matter of Example 1 or 2, wherein the inductor comprises: first traces of the first integrated circuit die in an internal metal layer; second traces of the first integrated circuit die that are co-planar with the external surface of the die; first traces of the second integrated circuit die that are co-planar with the external surface of the die; and second traces of the second integrated circuit die in an internal metal layer.

Example 8 includes the subject matter of Example 7, wherein: the first traces of the first integrated circuit die are connected to the first traces of the second integrated circuit die through a metal bonding pad of the first integrated circuit die; the first traces of the second integrated circuit die are connected to the second traces of the first integrated circuit die; and the second traces of the first integrated circuit die are connected to the second traces of the second integrated circuit die through a metal bonding pad of the second integrated circuit die.

Example 9 includes the subject matter of Example 1 or 5, wherein the inductor comprises: first traces in an internal metal layer of the first integrated circuit die; second traces in an internal metal layer of the second integrated circuit die; and third traces coupling the first traces and second traces, the third traces comprising the metal bonding pads of the first integrated circuit die, the metal bonding pads of the second integrated circuit die, and vias between the traces in the internal metal layers and the metal bonding pads.

Example 10 includes the subject matter of Example 9, wherein the third traces further comprise portions of other internal metal layers of the first integrated circuit die and the second integrated circuit die.

Example 11 includes the subject matter of any one of Examples 1-10, wherein a density of metal on the external surface of the first integrated circuit die is substantially constant across the surface, and a density of metal on the external surface of the second integrated circuit die is substantially constant across the surface.

Example 12 includes integrated circuit assembly comprising: a package substrate; and a multi-die apparatus coupled to the package substrate, the multi-die apparatus according to any one of Examples 1-11.

Example 13 includes a computing system comprising memory and a processor, the processor comprising a multi-die apparatus according to any one of Examples 1-11 or an integrated circuit assembly according to Example 12.

In the above description, various aspects of the illustrative implementations have been described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials, and configurations have been set forth to provide a thorough understanding of the illustrative implementations. However, it will be apparent to one skilled in the art that the present disclosure may be practiced without all of the specific details. In other instances, well-known features have been omitted or simplified in order not to obscure the illustrative implementations.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

Moreover, the phrase "located on" as used herein in the context of a first layer or component located on a second layer or component refers to the first layer or component being directly physically attached to the second part or component (no layers or components between the first and second layers or components) or physically attached to the second layer or component with one or more intervening layers or components.

Further, the term "adjacent" as used herein refers to layers or components that are in physical contact with each other. That is, there is no layer or component between the stated adjacent layers or components. For example, a layer X that is adjacent to a layer Y refers to a layer that is in physical contact with layer Y.

The above description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

The invention claimed is:

1. A multi-die apparatus comprising:
   a first integrated circuit die comprising metal bonding pads that are co-planar with an external surface of the die;
   a second integrated circuit die comprising metal bonding pads that are co-planar with an external surface of the die, wherein the second integrated circuit die is coupled to the first integrated circuit die such that the external surface of the first integrated circuit die is in contact with the external surface of the second integrated circuit die and the metal bonding pads of the first integrated circuit die are in direct contact with respective metal bonding pads of the second integrated circuit die; and
   an inductor formed by traces in the first integrated circuit die, traces in the second integrated circuit die, a subset of the metal bonding pads of the first integrated circuit die, and a subset of the metal bonding pads of the second integrated circuit die.

2. The apparatus of claim 1, wherein the inductor comprises one or more coils arranged to produce a magnetic field orthogonal to the external surfaces of the integrated circuit dies.

3. The apparatus of claim 1, wherein:
   the first integrated circuit die comprises traces that are co-planar with the external surface of the die;
   the second integrated circuit die comprises traces that are co-planar with the external surface of the die; and
   the inductor is formed at least partially by the traces of the first integrated circuit die that are co-planar with the external surface of the first integrated circuit die and the traces of the second integrated circuit die that are co-planar with the external surface of the second integrated circuit die.

4. The apparatus of claim 3, wherein the traces of the first integrated circuit die that are co-planar with the external surface of the first integrated circuit die are not in contact with the traces of the second integrated circuit die that are co-planar with the external surface of the second integrated circuit die.

5. The apparatus of claim 1, wherein the inductor comprises one or more coils arranged to produce a magnetic field co-planar with the external surfaces of the integrated circuit dies.

6. The apparatus of claim 1, wherein the first integrated circuit die comprises internal metal layers;

the second integrated circuit die comprises internal metal layers; and the inductor is formed at least partially by traces in the internal metal layers of the first integrated circuit die and traces in the internal metal layers of the second integrated circuit die.

7. The apparatus of claim 1, wherein the inductor comprises:

first traces of the first integrated circuit die in an internal metal layer;

second traces of the first integrated circuit die that are co-planar with the external surface of the die;

first traces of the second integrated circuit die that are co-planar with the external surface of the die; and second traces of the second integrated circuit die in an internal metal layer.

8. The apparatus of claim 7, wherein:

the first traces of the first integrated circuit die are connected to the first traces of the second integrated circuit die through a metal bonding pad of the first integrated circuit die;

the first traces of the second integrated circuit die are connected to the second traces of the first integrated circuit die; and the second traces of the first integrated circuit die are connected to the second traces of the second integrated circuit die through a metal bonding pad of the second integrated circuit die.

9. The apparatus of claim 1, wherein the inductor comprises:

first traces in an internal metal layer of the first integrated circuit die;

second traces in an internal metal layer of the second integrated circuit die; and third traces coupling the first traces and second traces, the third traces comprising the metal bonding pads of the first integrated circuit die, the metal bonding pads of the second integrated circuit die, and vias between the traces in the internal metal layers and the metal bonding pads.

10. The apparatus of claim 9, wherein the third traces further comprise portions of other internal metal layers of the first integrated circuit die and the second integrated circuit die.

11. The apparatus of any claim 1, wherein a density of metal on the external surface of the first integrated circuit die is substantially constant across the surface, and a density of metal on the external surface of the second integrated circuit die is substantially constant across the surface.

12. An integrated circuit assembly comprising:

a package substrate; and a multi-die complex coupled to the package substrate, the multi-die complex comprising:

a first integrated circuit die comprising metal bonding pads that are co-planar with an external surface of the die;

a second integrated circuit die comprising metal bonding pads that are co-planar with an external surface of the die, wherein the second integrated circuit die is coupled to the first integrated circuit die such that the external surface of the first integrated circuit die is in contact with the external surface of the second integrated circuit die and the metal bonding pads of the first integrated circuit die are in direct contact with respective metal bonding pads of the second integrated circuit die; and an inductor formed by traces in the first integrated circuit die, traces in the second integrated circuit die, a subset of the metal bonding pads of the first integrated circuit die and a subset of the metal bonding pads of the second integrated circuit die.

13. The integrated circuit assembly of claim 12, wherein the inductor comprises one or more coils arranged to produce a magnetic field orthogonal to the external surfaces of the integrated circuit dies.

14. The integrated circuit assembly of claim 12, wherein:

the first integrated circuit die comprises traces that are co-planar with the external surface of the die;

the second integrated circuit die comprises traces that are co-planar with the external surface of the die; and the inductor is formed at least partially by the traces of the first integrated circuit die that are co-planar with the external surface of the first integrated circuit die and the traces of the second integrated circuit die that are co-planar with the external surface of the second integrated circuit die.

15. The integrated circuit assembly of claim 14, wherein the traces of the first integrated circuit die that are co-planar with the external surface of the first integrated circuit die are not in contact with the traces of the second integrated circuit die that are co-planar with the external surface of the second integrated circuit die.

16. The integrated circuit assembly of claim 12, wherein the inductor comprises one or more coils arranged to produce a magnetic field co-planar with the external surfaces of the integrated circuit dies.

17. The integrated circuit assembly of claim 12, wherein the first integrated circuit die comprises internal metal layers;

the second integrated circuit die comprises internal metal layers; and the inductor is formed at least partially by traces in the internal metal layers of the first integrated circuit die and traces in the internal metal layers of the second integrated circuit die.

18. The integrated circuit assembly of claim 12, wherein a density of metal on the external surface of the first integrated circuit die is substantially constant across the surface, and a density of metal on the external surface of the second integrated circuit die is substantially constant across the surface.

19. The integrated circuit assembly of claim 12, further comprising a main circuit board, wherein the package substrate is coupled to the main circuit board.

20. A computing system comprising:

memory; and a processor comprising:

a first integrated circuit die comprising metal bonding pads that are co-planar with an external surface of the die;

21 a second integrated circuit die comprising metal bonding pads that are co-planar with an external surface of the die, wherein the second integrated circuit die is coupled to the first integrated circuit die such that the external surface of the first integrated circuit die is in contact with the external surface of the second integrated circuit die and the metal bonding pads of the first integrated circuit die are in direct contact with respective metal bonding pads of the second integrated circuit die; and an inductor formed by traces in the first integrated circuit die, traces in the second integrated circuit die, a subset of the metal bonding pads of the first integrated circuit die and a subset of the metal bonding pads of the second integrated circuit die.

21. The computing system of claim 20, wherein the inductor comprises one or more coils arranged to produce a magnetic field orthogonal to the external surfaces of the integrated circuit dies.

22. The computing system of claim 20, wherein:

the first integrated circuit die comprises traces that are co-planar with the external surface of the die;

22 the second integrated circuit die comprises traces that are co-planar with the external surface of the die; and the inductor is formed at least partially by the traces of the first integrated circuit die that are co-planar with the external surface of the first integrated circuit die and the traces of the second integrated circuit die that are co-planar with the external surface of the second integrated circuit die.

23. The computing system of claim 20, wherein the inductor comprises one or more coils arranged to produce a magnetic field co-planar with the external surfaces of the integrated circuit dies.

24. The computing system of claim 20, wherein:

the first integrated circuit die comprises internal metal layers;

the second integrated circuit die comprises internal metal layers; and the inductor is formed at least partially by traces in the internal metal layers of the first integrated circuit die and traces in the internal metal layers of the second integrated circuit die.

* * * * *